(12) United States Patent
Banno et al.

(10) Patent No.: US 6,763,511 B2
(45) Date of Patent: Jul. 13, 2004

(54) SEMICONDUCTOR INTEGRATED CIRCUIT HAVING MACRO CELLS AND DESIGNING METHOD OF THE SAME

(75) Inventors: Akihiro Banno, Tokyo (JP);
Shinichirou Ooshige, Tokyo (JP);
Masaru Shintani, Kanagawa (JP);
Masaru Matsui, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 81 days.

(21) Appl. No.: 10/185,394

(22) Filed: Jun. 28, 2002

(65) Prior Publication Data

US 2003/0001171 A1 Jan. 2, 2003

(30) Foreign Application Priority Data

Jul. 2, 2001 (JP) ........................................ 2001-239947

(51) Int. Cl.[7] .............................................. G06F 17/50
(52) U.S. Cl. .............................. 716/12; 716/13; 716/14
(58) Field of Search .............................. 716/12, 13, 14; 438/598, 599, 587

(56) References Cited

U.S. PATENT DOCUMENTS

| | | | | |
|---|---|---|---|---|
| 4,811,237 A | * | 3/1989 | Putatunda et al. ............. | 716/9 |
| 5,824,570 A | * | 10/1998 | Aoki et al. .................. | 438/128 |
| 5,972,740 A | * | 10/1999 | Nakamori .................... | 438/129 |
| 6,025,616 A | * | 2/2000 | Nguyen et al. ............. | 257/207 |
| 6,305,000 B1 | * | 10/2001 | Phan et al. ..................... | 716/5 |
| 6,306,745 B1 | * | 10/2001 | Chen .......................... | 438/599 |
| 6,480,989 B2 | * | 11/2002 | Chan et al. .................... | 716/8 |
| 6,539,530 B1 | * | 3/2003 | Torii .............................. | 716/2 |

* cited by examiner

*Primary Examiner*—A. M. Thompson
*Assistant Examiner*—Sun James Lin
(74) *Attorney, Agent, or Firm*—Scully, Scott Murphy & Presser

(57) ABSTRACT

The present invention enables to design a semiconductor integrated circuit with a small chip area and a small number of wiring layers at a low cost for a short time. In the present design method of the semiconductor integrated circuit, a first wiring group (a horizontal power wiring and horizontal ground wirings) and a second wiring group (a horizontal power wiring and horizontal ground wirings), which are opposite to each other, are arranged at the outside of a macro outer frame, a third wiring group (a vertical power wiring and a vertical ground wiring) is arranged to correspond to a power terminal and a ground terminal on a macro cell, and these first and second wiring groups are connected to the power terminal and the ground terminal by the third wiring group.

18 Claims, 16 Drawing Sheets

PRIOR ART

PRIOR ART

SEMICONDUCTOR INTEGRATED CIRCUIT HAVING MACRO CELLS AND DESIGNING METHOD OF THE SAME

BACKGROUND OF THE INVENTION

1. Field of the Invention

The present invention relates to a semiconductor integrated circuit and a designing method of the same, and more particularly to a semiconductor integrated circuit having macro cells and a designing method of the same.

2. Description of the Related Art

In recent years, attention has been paid to a system LSI with a plurality of macro cells on a semiconductor chip, having functions of a central processing unit (CPU), memory devices (ROM, RAM), buffer, peripheral devices that perform various kinds of signal processing, etc.

Since the system LSI comprises the plurality of macro cells, the circuit scale is so large that the direct circuit design for a transistor level cannot be achieved in actuality. For this reason, the system LSI is generally designed in such a manner that a system design, function design, specific logic design and circuit design are sequentially carried out stepwise.

In the system design, each of CPU, ROM, RAM, buffer, the plurality of peripheral devices is provided as one function block, and the operation and structure of the entire system are decided to obtain a desired function. In the function design, the relationship among the respective function blocks and the internal operations of the respective function blocks are decided based on the specification decided by the system design. In the specific logic design, the layout of macro cells for configuring the respective blocks whose internal operations are decided by the function design is performed on the semiconductor chip, and these macro cells are mutually wired (layout wiring) so as to generate a simulation model for a semiconductor integrated circuit. In the circuit design, an electric circuit for a transistor level and the characteristics of devices are decided to satisfy the circuit specification, which is based on the logic design having the function design and the specific logic design.

Here, the macro cells are composed of basic logic devices such as an inverter, a NAND gate, a NOR gate, etc., and basic logic circuits such as a latch, a counter, a memory, etc. formed by combining a plurality of basic logic devices. The macro cells are registered to a memory (library) of a CAD (Computer Aided Design) and the like where the respective functions are described using a programming language such as a hardware description language (HDL), C language (trade name), etc. Data of the simulation model for a semiconductor integrated circuit generated as mentioned above is complied with data of macro cells stored in the memory, thereafter a simulation for an operation is carried out to verify whether or not a desired function is obtained.

FIG. 17 is a top view showing a macro cell of the memory (hereinafter referred to as memory macro) that forms a cell base IC designed by the design method (logic design) of the conventional semiconductor integrated circuit and the peripheral portion thereof. The memory macro has a multilayer wiring structure. In this example, the explanation is given on the assumption that a three-layer wiring is used.

At an outer edge of a core section 1, the memory macro has a plurality of signal input/output terminals 2, power lead-in ground terminals $3a_{11}$, $3a_{12}$, $3b_{11}$ and $3b_{12}$, and power lead-in power terminals $3a_{21}$, $3a_{22}$, $3b_{21}$ and $3b_{22}$.

The power lead-in ground terminals $3a_{11}$ and $3a_{12}$, and the power lead-in power terminals $3a_{21}$ and $3a_{22}$ are formed by the wiring of second layer, and the power lead-in ground terminals $3b_{11}$ and $3b_{12}$, and the power lead-in power terminals $3b_{21}$ and $3b_{22}$ are formed by the wiring of the third layer.

A portion enclosed with a broken line provided at an outside of the core section 1 indicates a region where the memory macro is present, and is called a macro outer frame 4. In an interior of the core section 1, a ground terminal $5a_1$, a power terminal $5b_1$, a ground terminal $5a_2$ and a power terminal $5b_2$ are formed with a predetermined interval in a vertical direction of the figure. The ground terminals $5a_1$ and $5a_2$ and the power terminals $5b_1$ and $5b_2$ are formed by the wiring of the fourth layer, and connected to wiring to be connected to the ground and wiring to be connected to the power among wiring of the third layer, respectively.

Orbital power rings 6 and 7 are formed double at the outside of the macro outer frame 4 to surround the macro outer frame 4. The orbital power ring 6 includes horizontal ground wiring $6a_1$ and $6a_2$ and vertical ground lines $6b_1$ and $6b_2$. The horizontal ground wiring $6a_1$ and $6a_2$ are formed by the wiring of the third layer, and the vertical ground lines $6b_1$ and $6b_2$ are formed by the wiring of the second layer.

The orbital power ring 7 formed in the vicinity of the outer periphery of the orbital power ring 6 includes horizontal ground wiring $7a_1$ and $7a_2$ and vertical power lines $7b_1$ and $7b_2$. The horizontal power wiring $7a_1$ and $7a_2$ are formed by the wiring of the third layer, and the vertical power lines $7b_1$ and $7b_2$ are formed by the wiring of the second layer.

The power lead-in ground terminals $3a_{11}$ and $3a_{21}$ are connected to power lead-in ground lines $8a_{11}$ and $8a_{21}$, which are formed by the wiring of the second layer, respectively. Similarly, the power lead-in ground terminals $3a_{12}$ and $3a_{22}$, are connected to power lead-in ground lines $8a_{12}$ and $8a_{22}$, which are formed by the wiring of the second layer, respectively.

The power lead-in ground terminals $3b_{11}$ and $3b_{21}$, are connected to power lead-in ground lines $8b_{11}$ and $8b_{21}$, which are formed by the wiring of the third layer, respectively. The power lead-in ground terminals $3b_{12}$ and $3b_{22}$, are connected to power lead-in ground lines $8b_{12}$ and $8b_{22}$, which are formed by the wiring of the third layer, respectively.

The power lead-in ground lines $8a_{11}$ and $8a_{12}$ are connected to the horizontal ground wiring $6a_1$ and $6a_2$ through via holes, respectively, and the power lead-in ground lines $8a_{21}$ and $8a_{22}$ are connected to the horizontal power wiring $7a_1$ and $7a_2$ through via holes, respectively.

The power lead-in ground lines $8b_{11}$ and $8b_{12}$ are connected to the vertical ground lines $6b_1$ and $6b_2$ through via holes, respectively, and the power lead-in ground lines $8b_{21}$ and $8b_{22}$ are connected to the vertical power lines $7b_1$ and $7b_2$ through via holes, respectively.

The horizontal power ground lines $6a_1$ and the horizontal power wring $7a_1$ are connected to a vertical ground bus $9a$ and a horizontal power bus $9b$, which are formed by the wring of the fourth layer, through via holes, respectively.

As illustrated in FIG. 18, the vertical power bus $9a$ is connected to the horizontal ground wiring $6a_2$, which constitutes the orbital power ring 6 formed to enclose the macro outer frame 4, through a via hole. Similarly, the vertical power bus $9b$ is connected to the horizontal power wiring $7a_2$, which constitutes the orbital power ring 7 formed to enclose the macro outer frame 4, through a via hole.

The vertical ground line $6b_2$ is connected to a horizontal ground bus $10a$ formed in the first layer through a via hole, and the vertical power line $7b2$ is connected to a horizontal power bus $10b$ formed in the first layer through a via hole. The horizontal ground bus $10a$ is connected to the vertical ground line $6b1$, which constitutes the orbital power ring 6 formed to enclose the macro outer frame 4, through a via hole. The horizontal power bus $10b$ is connected to the vertical power line $6b_1$, which constitutes the orbital power ring 7 formed to enclose the macro outer frame 4, through a via hole.

In this way, the orbital power rings 6 and 7 are formed to enclose the macro outer frame 4 for each macro cell, and a current is supplied to the macro cell from the corresponding orbital ring.

Moreover, if a horizontal power bus $11a$ and a horizontal ground bus $11b$ on a semiconductor substrate (semiconductor chip) formed by the wiring of fifth layer pass on the memory macro, they are connected to the ground terminals $5a_1$ and $5a_2$, the power terminals $5b_1$ and $5b_2$, the vertical ground lines $6b_1$ and $6b_2$, power terminals $5b_1$ and $5b_2$, and vertical power lines $7b_1$ and $7b_2$ through via holes.

Since the power bus $11a$ and the horizontal ground bus $11b$ on the semiconductor substrate are arranged on the semiconductor chip with a different design from the macro, no bus is provide at the upper portion of the macro cell in some cases. In this case, the power and ground buses cannot be connected to the ground terminals $5a_1$, and $5a_2$, and the power terminals $5b_1$ and $5b_2$ through contact holes. For this reason, power and ground buses are formed in a sixth layer in a vertical direction and connected to the ground terminals $5_{a1}$, and $5a_2$, and the power terminals $5b_1$ and $5b_2$.

Thus, in the conventional structure, the six-layer wiring is required to supply a current to the macro cell stably.

In connection with power wiring, other macro cells have substantially the same structure as the aforementioned structure.

There has been a growth in the case that the system LSI, which is structured by mounting a plurality of macro cells thereon, is also provided to the portable electronic device, such as a computer of notebook-size, palm-size, pocket-size, etc., personal digital assistants (PDA), or cellular phone, personal handy-phone system (PHS). In such a portable electronic device, since the space is limited, the need for miniaturizing a chip area and the need for improving cost reduction arise.

In conventional, the line widths of the orbital power rings 6 and 7 are narrowed to reduce the chip area. However, the current supplied from the power flows through the orbital power rings 6 and 7 with a narrow line width to bypass the macro cell as shown by arrows, so that a resistance value increases and a current supply capability decreases. Particularly, there is a problem in that a large voltage drop occurs at a connection between the horizontal power wiring $7a1$ and the vertical power bus $9b$ (point A of FIG. 18).

Moreover, a reduction in the cost of semiconductor integrated circuit can be generally achieved by decreasing the number of wiring layers of the semiconductor integrated circuit and the number of processes. However, the general semiconductor integrated circuit needs at least five wiring layers. Particularly, in order to supply a stable current to the macro cell without depending on the presence or absence of the power bus and the ground bus on the semiconductor substrate, the sixth wiring layer is required as mentioned above. Accordingly, there is a problem in that the cost of the semiconductor integrated circuit cannot be reduced.

SUMMARY OF THE INVENTION

An object of the present invention is to provide a semiconductor integrated circuit, which can reduce a chip area and has a small number of wiring layers, and its designing method.

A semiconductor integrated circuit according to the present invention includes: a macro cell arranged on a chip; a plurality of power terminals formed on an upper portion of the macro cell, and a plurality of ground terminals formed thereon; a first wiring group including at least one power wiring and one ground wiring extended in a first direction along a first side of the macro cell; a second wiring group including at least one power wiring and one ground wiring extended in the first direction along a second side of the macro cell opposite to the first side; and a third wiring group, which is arranged in a second direction on the macro cell, and which include at least one power wiring and one ground wiring for establishing connection between the first wiring group and the second wiring group, wherein the power wring and the ground wring which form the third wiring group are respectively connected to the corresponding power terminal and the corresponding ground terminal on the macro cell.

With the above structure, connection between the first wiring group and the second wiring group can be made by numerous power wiring and ground wiring, making it possible to reduce a voltage drop therebetween and to connect the power terminals and ground terminals formed on the macro cells.

A semiconductor integrated circuit manufacturing method according to the present invention includes the steps of: arranging a macro cell having a first side, a second side opposite to the first side, a third side, and a fourth side opposite to the third side on a semiconductor chip, and having at least one power terminal and one ground terminal on its top surface; arranging a first wiring group including at least one power wiring and one ground wiring in a predetermined range from the first side and extended in a first direction; arranging a second wiring group including at least one power wiring and one ground wiring in the predetermined range from the second side and extended in the first direction; arranging a third wiring group including at least one power wiring and one ground wiring in the predetermined range from the third side and extended in the second direction so as to connect the first wring group to the second wiring group; arranging a fourth wiring group including at least one power wiring and one ground wiring in the predetermined range from the fourth side and extended in the second direction so as to connect the first wring group to the second wiring group; and arranging a fifth wiring group including at least one power wiring and one ground wiring between the first wring group and the second wiring group in accordance with the power terminal and the ground terminal.

With the above design method, the design of a macro cell and the design of wiring group for supplying the current to the macro cell can be separately carried out.

DETAILED DESCRIPTION OF THE DRAWINGS

DETAILED DESCRIPTION OF THE PREFERRED EMBODIMENTS

An embodiment of this invention will be explained with reference to the drawings accompanying herewith. The explanation will be specifically given using the embodiment.

A semiconductor integrated circuit, which is one embodiment of the present invention, will be explained with reference to FIGS. 1 and 2.

A core section 22 of macro cell is composed of a three-layered wiring layer. It is assumed that power terminals $25_1$, $25_2$ and ground terminals $26_1$, $26_2$ are formed on the uppermost layer of macro cell by the wiring layer of the third layer as illustrated in FIG. 2.

Figure 1:
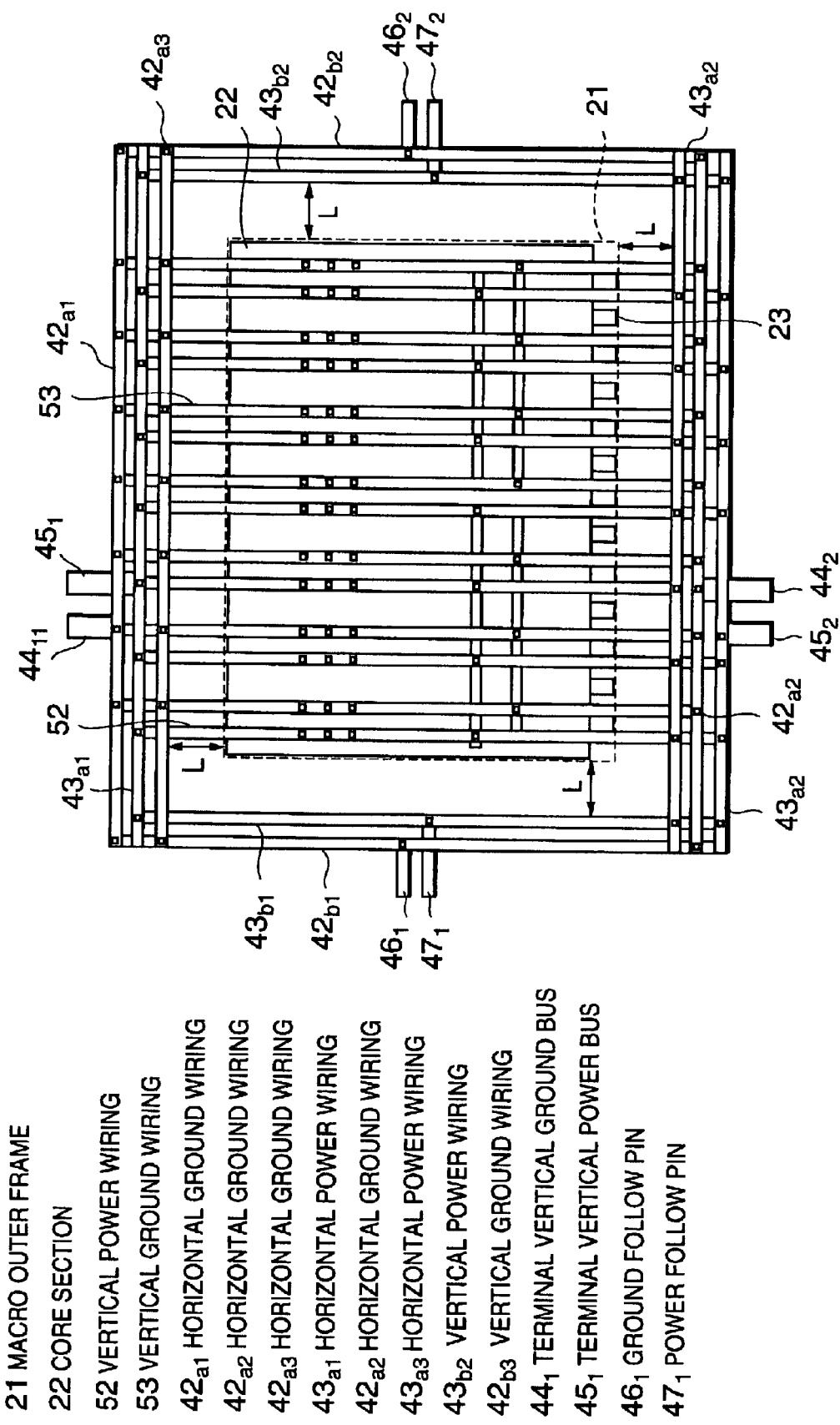
FIG. 1 is a view showing one embodiment of the semiconductor integrated circuit to which the present invention is applied.
Figure 2:
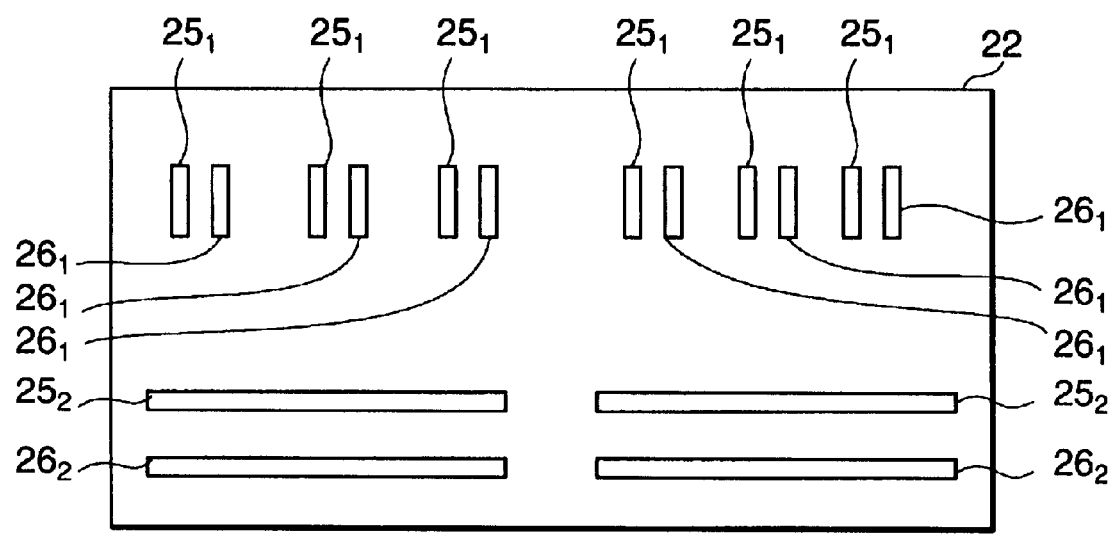
FIG. 2 is a top view of a core section of a macro cell.

As illustrated in FIG. 1, a macro outer frame 21, which includes the outside of a signal terminal 2, is provided at the outside of the core section 22 of macro cell, and horizontal ground wiring $42_{a3}$, horizontal power wring $43_{a3}$ are formed at a distance of a predetermined length L from long sides, which are upper and lower sides of the macro outer frame, by the wiring layer of the fifth layer. At the outsides of the horizontal ground wiring $42_{a3}$ and the horizontal power wring $43_{a3}$, horizontal power wiring $43_{a1}$ and horizontal ground wring $42_{a2}$ are formed by the wiring layer of the fifth layer, respectively. If there is a space at the outside regions of the horizontal power wiring $43_{a1}$ and the horizontal ground wring $42_{a2}$, horizontal ground wiring $42_{a1}$ and horizontal power wring $43_{a2}$ are formed at the outsides of the horizontal power wiring $43a_1$ and the horizontal ground wiring $42a_2$ by the wiring layer of the fifth layer, respectively.

At a distance of a predetermined length L from short sides, which are right and left sides of the macro outer frame 21, vertical power lines $43_{b1}$ and $43_{b2}$ are formed by the wiring layer of the fourth layer. At the outsides thereof, vertical ground lines $42_{b1}$ and $42_{b2}$ are formed, respectively. The vertical power lines $43_{b1}$ and $43_{b2}$ are connected to the horizontal power wiring $43_{a1}$ to $43_{a3}$ through contact holes. The vertical ground lines $42_{b1}$ and $42_{b2}$ are connected to the horizontal ground wiring $42_{a1}$ to $42_{a2}$ through contact holes.

In this way, the horizontal power wiring $43_{a1}$ to $43_{a3}$, horizontal ground wiring $42_{a1}$ to $42_{a3}$, vertical power lines $43_{b1}$ and $43_{b2}$ and vertical ground lines $42_{b1}$ and $42_{b2}$ form an artificial orbital ring that is formed by the wring layers of the fourth and fifth layers.

A power supply to the macro core section 22 from the artificial orbital ring is carried out by a plurality of vertical power lines 53, which establishes a connection between the horizontal power wiring $43_{a1}$, $43_{a2}$, and $43_{a3}$, and a plurality of vertical ground lines 52, which establishes a connection between the horizontal ground wiring $42_{a1}$, $42_{a3}$, and $42_{a2}$. The vertical power lines 53 and vertical ground lines 52 are formed by the wiring layer of the fourth layer.

The vertical power lines 53 and vertical ground lines 52 are connected to power terminals and ground terminals, which are formed by the wiring of the third layer on the macro core section 22, through contact holes, respectively, so that power is supplied to the macro core section 22.

Additionally, the power terminals $25_1$ and the ground terminals $26_1$, which are formed in the same direction as the vertical power lines 53 and the vertical ground lines 52, are connected to the vertical power lines 53 and the vertical ground lines 52, which are respectively arranged to pass on these terminals, through the contact holes. The power terminals $25_1$ and the ground terminals $26_2$, which are formed in a direction perpendicular to the vertical power lines 53 and vertical ground lines 52, are connected through the contact holes at points intersecting with the vertical power lines 53 and the vertical ground lines 52, respectively.

Moreover, a ground follow pin $46_1$, which is formed by the wiring layer of the first layer, is connected through a via hole to a lower portion of the vertical ground wiring $42_{b1}$ of the fourth layer perpendicular to the ground follow pin $46_1$. A ground follow pin $46_2$ of the first layer, is connected through a via hole to a lower portion of the vertical ground wiring $42_{b2}$ of the fourth layer perpendicular to the ground follow pin $46_2$. Similarly, a power follow pin $47_1$ of the first layer, is connected through a via hole to a lower portion of the vertical power wiring $43_{b1}$ of the fourth layer perpendicular to the power follow pin $47_1$. A power follow pin $47_2$ of the first layer, is connected through a via hole to a lower portion of the vertical power wiring $43_{b2}$ of the fourth layer perpendicular to the power follow pin $47_2$. These follow pins are also used to supply power to a primitive cell such as an inverter provided on the semiconductor substrate and to adjacent macro cells.

By the connection mentioned above, numerous current paths that run from the upper portion of the macro cell to the lower portion thereof are made. This makes it possible to reduce a voltage drop occurred at a terminal power bus $45_2$ and a terminal ground bus $44_2$ even when connections to the power and the ground through a terminal power bus $44_1$ and a terminal ground bus $45_1$, which are formed by the wiring of the fourth layer, are respectively established. Namely, according to the above-mentioned constitution, as is understood from FIG. 1, the horizontal power lines $43_{a1}$ to $43_{a3}$, which forms the artificial orbital power ring, are connected linearly with the plurality of vertical power lines 52 formed with a predetermined pitch. Similarly, the horizontal ground wiring $42_{a1}$ to $42_{a3}$, which forms the artificial orbital power ring, are connected linearly with the plurality of vertical ground lines 53 formed with a predetermined pitch. Accordingly, since the current flows through the plurality of pairs of vertical power lines 52 and vertical ground lines 53 linearly even if other macro cell is formed at upper and lower or right and left portions of the macro cell, no voltage drop occurs partially due to dispersion of the current unlike the conventional case. Moreover, the power terminal and ground terminal of the macro cell, formed in the third layer, are connected to the vertical power wiring and the vertical ground wiring, and the current is uniformly provided to the macro cell, eliminating the need for increasing the number of wiring layers unlike the conventional case. Still moreover, since the semiconductor integrated circuit can be designed without considering the voltage drop, it is possible to shorten designing time.

Figure 4:
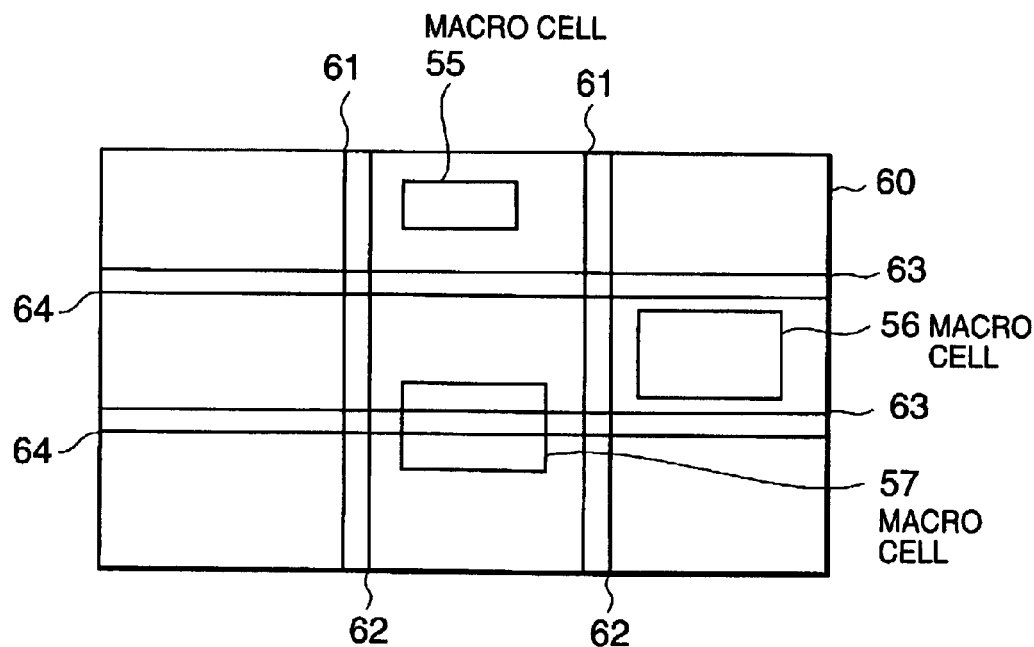
FIG. 4 is a view showing a positional relationship between macro cells and the chip internal power/ground buses.

In the embodiment described above, since the macro cell is placed at the position of a macro cell 55 of FIG. 4 and is separated from the chip internal power bus and the chip internal ground bus, the current is supplied to the macro cell through a terminal vertical ground bus $44_1$ and a terminal vertical power bus $45_1$, which are formed by the wiring layer of the fourth layer, from these buses.

Figure 3:
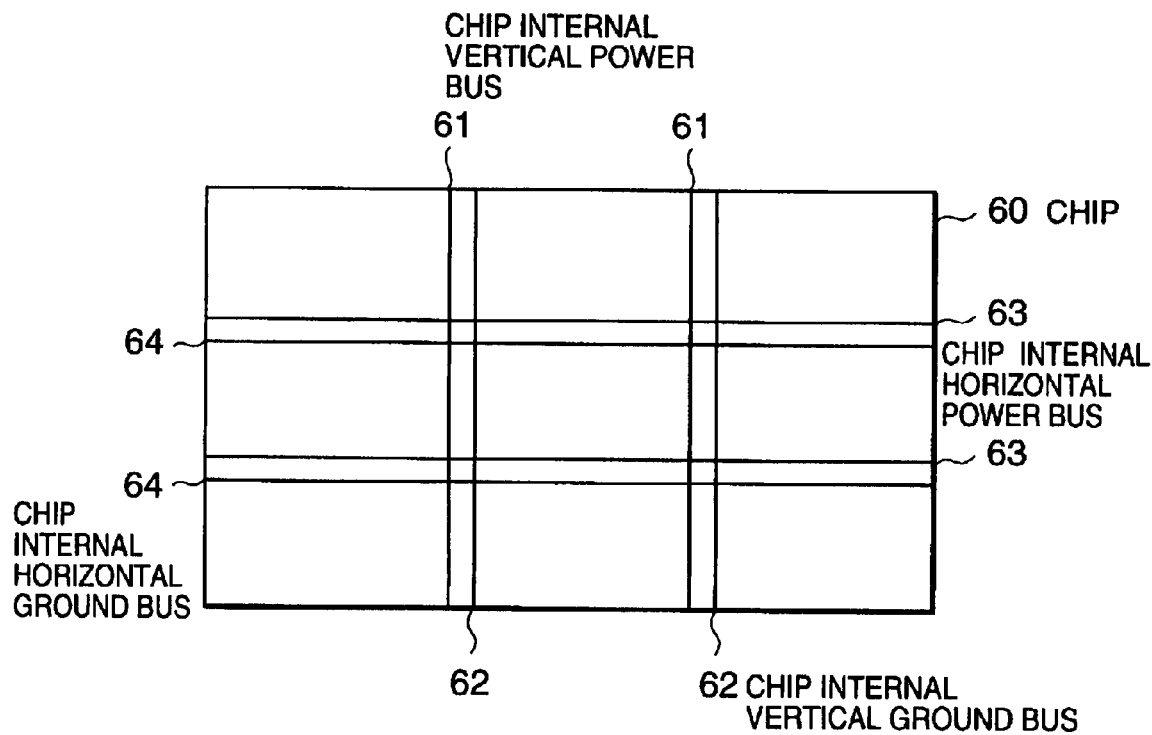
FIG. 3 is a view showing chip internal power/ground buses on a chip.

The chip internal power buses and the chip internal ground buses are arranged on the chip on which the macro cell is mounted based on data of the chip as shown in FIG. 3. In other words, the chip internal power buses and the chip internal ground buses are formed by chip internal vertical power buses 61 and chip internal vertical ground buses 62, which are formed by the wiring layer of the fourth layer, and chip internal horizontal power buses 63 and chip inter horizontal ground buses 64, which are formed by the wiring layer of the fifth layer.

An explanation will be next given of a first example of application.

Figure 9:
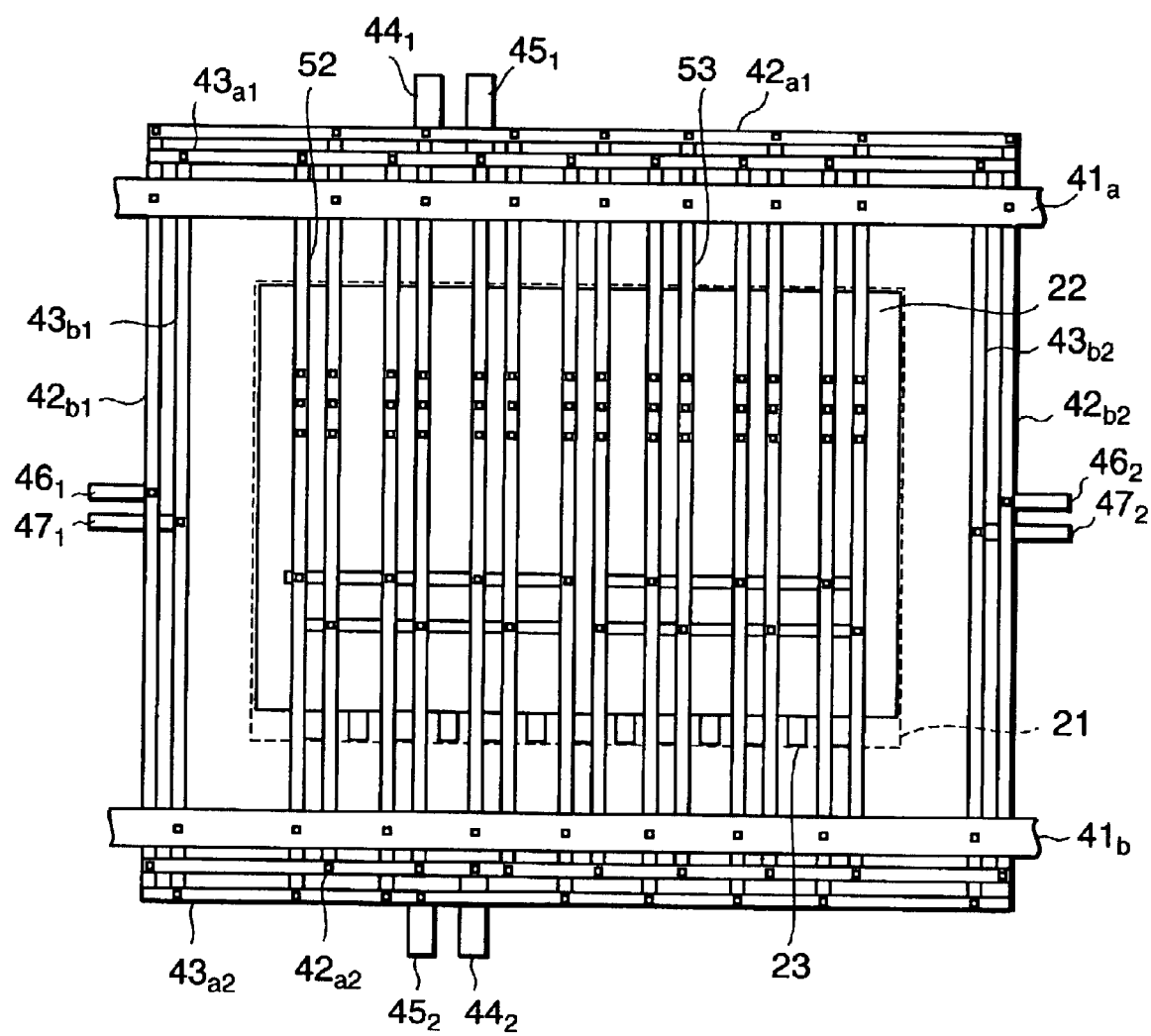
FIG. 9 is a view showing an application example of the semiconductor integrated circuit to which the present invention is applied.

As mentioned above, since the power bus/ground bus and the power wiring/ground wiring are designed separately for the macro cell and the chip 60, the macro cell is placed at the position of macro cell 56 shown in FIG. 4 and chip internal horizontal power buses 63 and chip internal horizontal ground buses 64, which are formed in a horizontal direction by the wiring layer of the fifth layer, pass near the outside of the macro cell in some cases. In this case, these chip internal horizontal power buses 63 and chip internal horizontal ground buses 64 can be used as a part of the horizontal power wiring and horizontal ground wiring. This example of application is shown in FIG. 9. Here, the chip internal horizontal ground wiring 64 and the chip internal horizontal power wiring 63 are used as a horizontal chip internal ground bus $41a$ and horizontal chip internal power bus $41b$, respectively. However, when only one of the chip internal horizontal power bus 63 and the chip internal horizontal ground bus 64 is placed near the macro cell, only the corresponding one may be used. This makes it possible to supply a current, which is more stable than the embodiment of FIG. 1, to the macro cell.

An explanation will be next given of a second example of application.

Unlike the first example of application, there is a case in which the macro cell is placed at the position of a macro cell 57 and the chip internal horizontal power bus 63 and the chip internal horizontal ground bus 64 pass on the macro cell as shown in FIG. 4. In this case, the chip internal horizontal power bus 63 and the chip internal horizontal ground bus 64 of FIG. 4 can be used as a chip internal horizontal power bus $41b$ and a chip internal horizontal ground bus $41a$ of FIG. 10, respectively.

Since the chip internal horizontal power bus $41b$ and the chip internal horizontal ground bus $41a$ are formed by the wring layer of the fifth layer, the chip internal horizontal power bus $41b$ and the chip internal horizontal ground bus $41a$ can be connected to the vertical power wiring 52 and the vertical ground wiring 53 through the contact holes, respectively, at the points intersecting with the vertical power wiring 52 and the vertical ground wiring 53, which are formed in a vertical direction by the wiring layer of the fourth layer. The connection in this way makes it possible to a current, which is more stable than the embodiment of FIG. 1, to the macro cell. In addition, FIG. 10 has explained the case in which both the chip internal horizontal power bus 63 and the chip internal horizontal ground bus 64 are arranged on the macro cell. However, when only one of them is placed on the macro cell, the corresponding one may be connected to the corresponding vertical power wring 52 or vertical ground wiring 53.

Moreover, the above two examples of application has explained the chip internal horizontal power buses and the chip internal horizontal ground buses, which are arranged/formed in the chip 60. However, as shown in FIG. 3, the chip internal vertical power buses 61 and the chip internal vertical ground buses 62, which are formed by the wiring of the fourth layer, are also arranged in the chip 60. Accordingly, the chip internal vertical power buses 61 and the chip internal vertical ground buses 62 maybe used as a part of vertical power wiring and vertical ground wiring $42_{b1}$, $42_{b1}$, $43_{b1}$ and $43_{b2}$ based on the same technical concept as that of the first example of application. Moreover, similar to the second example of application, the chip internal vertical power bus 61 and the chip internal vertical ground bus 62, which are arranged on the macro cell, may be connected to the vertical power wiring and the vertical ground wiring $42_{a1}$ to $42_{a3}$ and $43_{a1}$ to $43_{a3}$ perpendicular to the chip internal vertical power bus 61 and the chip internal vertical ground bus 62, respectively.

In this way, the semiconductor integrated circuit provided by the aforementioned embodiment and examples of application can carry out stable current supply to the macro cell and reduce the influence of voltage drop at the position away from the terminal vertical power bus $44_1$ and terminal vertical ground bus $45_1$.

An explanation will be next given of the design method of the aforementioned semiconductor integrated-circuit.

Figure 19:
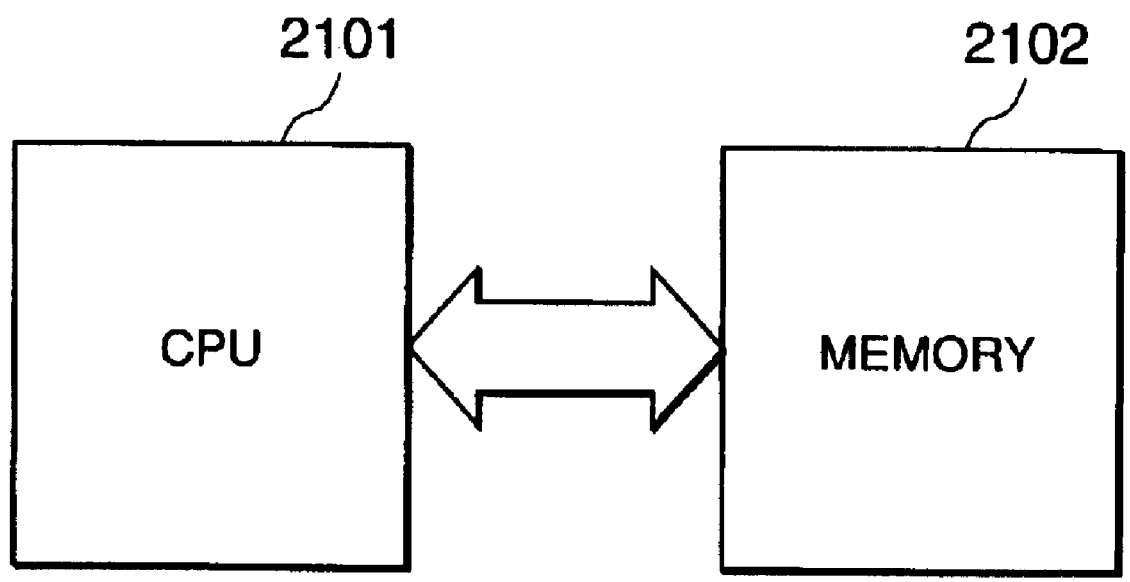
FIG. 19 is a schematic view of a system in which a program having the design method of the present invention is stored is executed.

This design method of the semiconductor integrated circuit is carried out when a CPU 2101 executes a design program of the semiconductor integrated circuit stored in a memory 2102 at a system having the CPU 2101 and the memory 2102 as illustrated in FIG. 19. In the memory 2102, data of power terminal and ground terminal of the macro cell, data of the chip, and data of the semiconductor chip internal power wiring are held, and read and processed by CPU in accordance with executing the design program.

First of all, an explanation will be given of the arrangement conditions of the macro cell, and the power terminals and ground terminals with reference to FIGS. 11 to 16.

Figure 11:
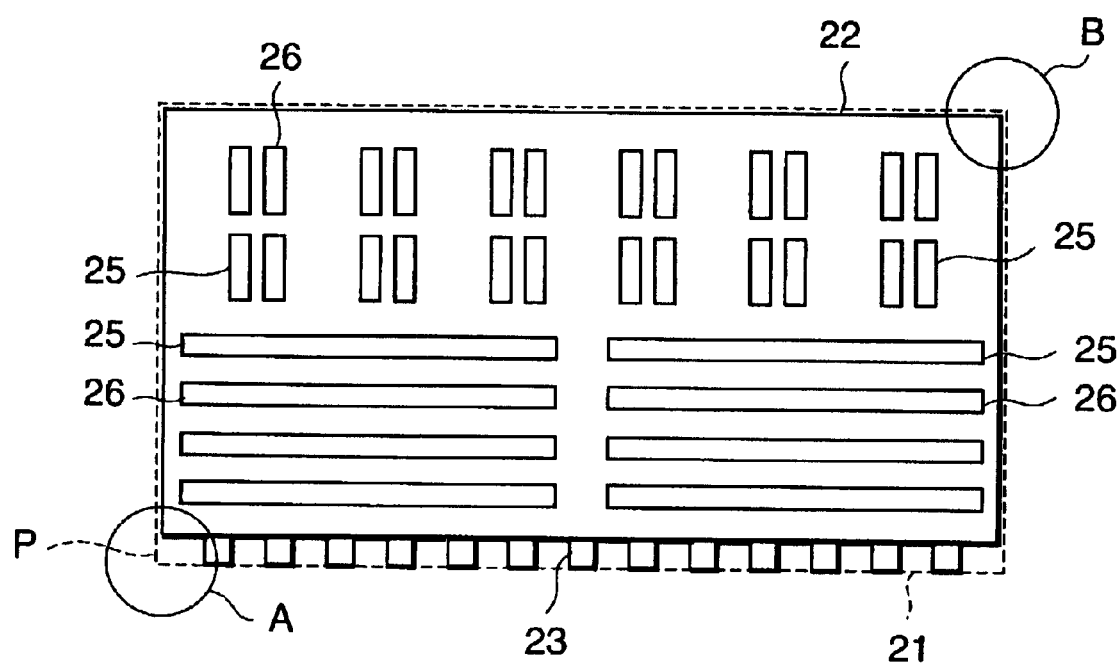
FIG. 11 is a view explaining an outline of a layout specification of the macro cell.

(1) The core section 22 of macro cell has power terminals 25 and ground terminals 26 as illustrated in FIG. 11 so as to define the macro outer frame 21 including the core section 22 and signal input and output terminals 23.

(2) Assumed that the core section 22 is rectangular or L-shaped.

(3) Assumed that the outer shape including the input/output terminal of macro cell, macro outer frame 21, layout data of the internal macro cell, coordinates of four corners (terminal points of paths) of the rectangular wiring, and original point (point P) of the macro outer frame 21 are prestored in the memory 2102.

Next, it is assumed that the power terminals and ground terminals of macro cell satisfy the following conditions:

(1) The power terminals 25 and the ground terminals 26 for connecting with the power wiring and the ground wiring are formed by the wiring layer of the third layer of the core section 22.

(2) Assumed that the power terminals 25 and the ground terminals 26 are rectangular.

Figure 12:
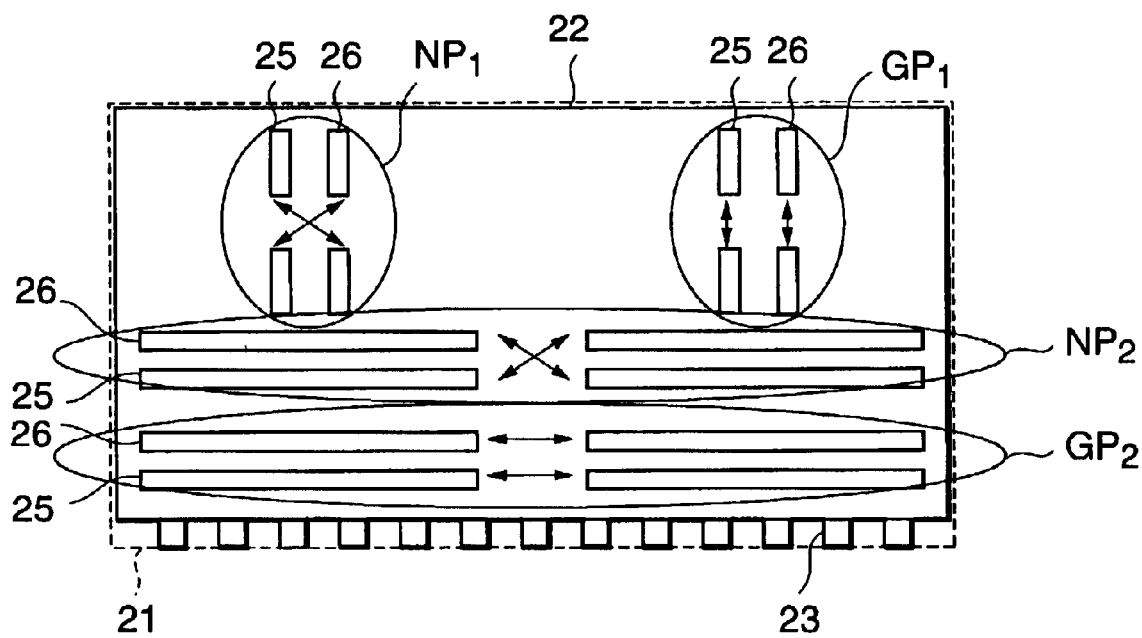
FIG. 12 is a view explaining the outline of a layout specification of the macro cell.

(3) Assumed that the positional relationship between the power terminals 25 and the ground terminals 26 is equal to possible positional relationships $GP_1$ and $GP_2$ where the terminals of the same kind are arranged to be connectable without intersecting the wiring that connects the terminals of the different kind as shown in FIG. 12. Namely, it is assumed that there are no impossible positional relationships $NP_1$ and $NP_2$ where the terminals of the same kind are arranged not to be connected to each other unless they intersect the wiring that connects the terminals of the different kind.

Figure 13:
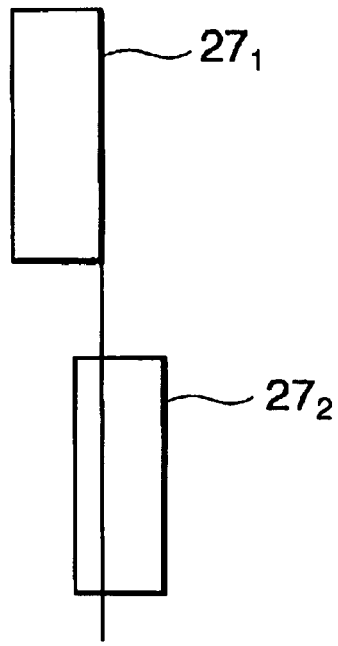
FIG. 13 is a view explaining the outline of a layout specification of the macro cell.
Figure 14:
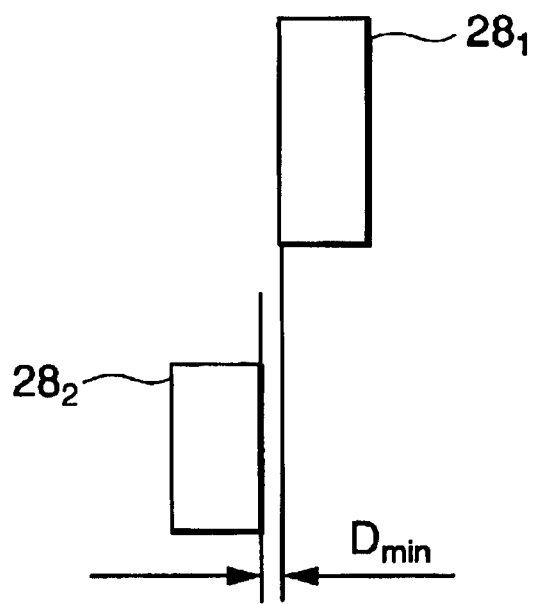
FIG. 14 is a view explaining the outline of a layout specification of the macro cell.

(4) Even if the positional relationship between the power terminal 25 and the ground terminal 26 is equal to possible positional relationships $GP_1$ and $GP_2$, terminals $27_1$ and $27_2$ of the same kind adjacent in the vertical direction or horizontal direction must be arranged so that their axes are not shifted as much as possible, as shown in FIG. 13. The short sides of terminals $27_1$ and $27_2$ have the same size to the utmost.

Figure 15:
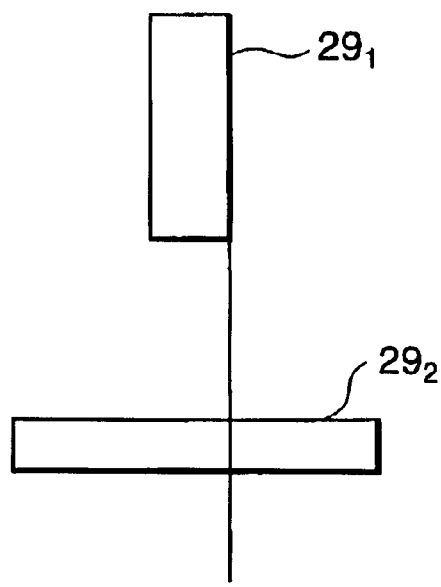
FIG. 15 is a view explaining the outline of a layout specification of the macro cell.
Figure 16:
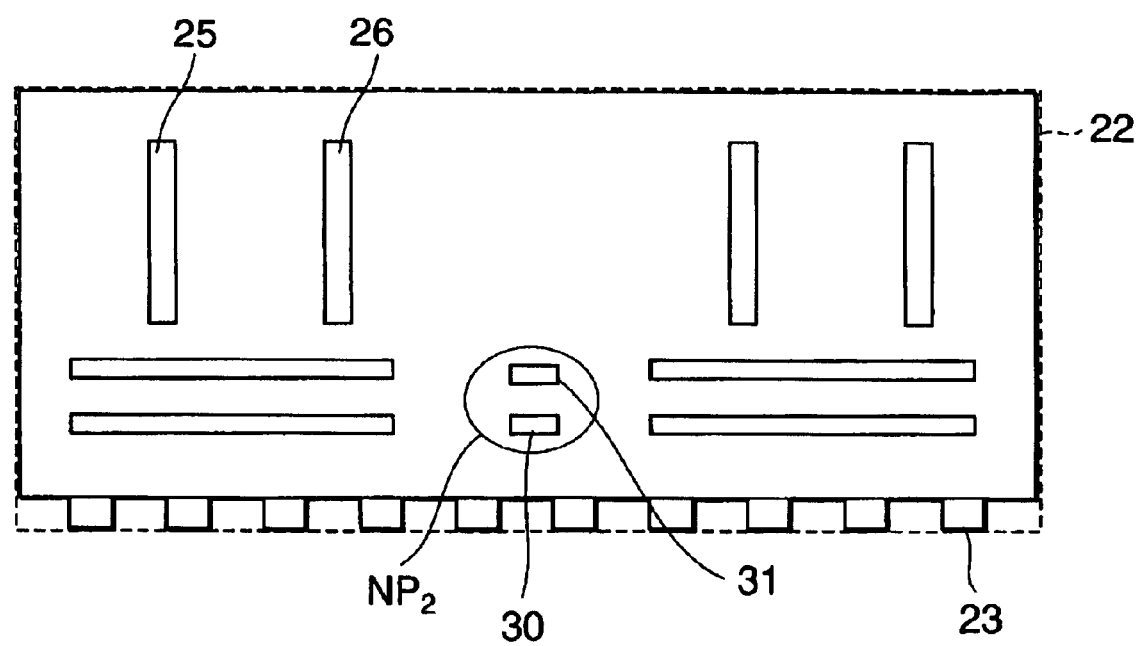
FIG. 16 is a view explaining the outline of a layout specification of the macro cell.
Figure 17:
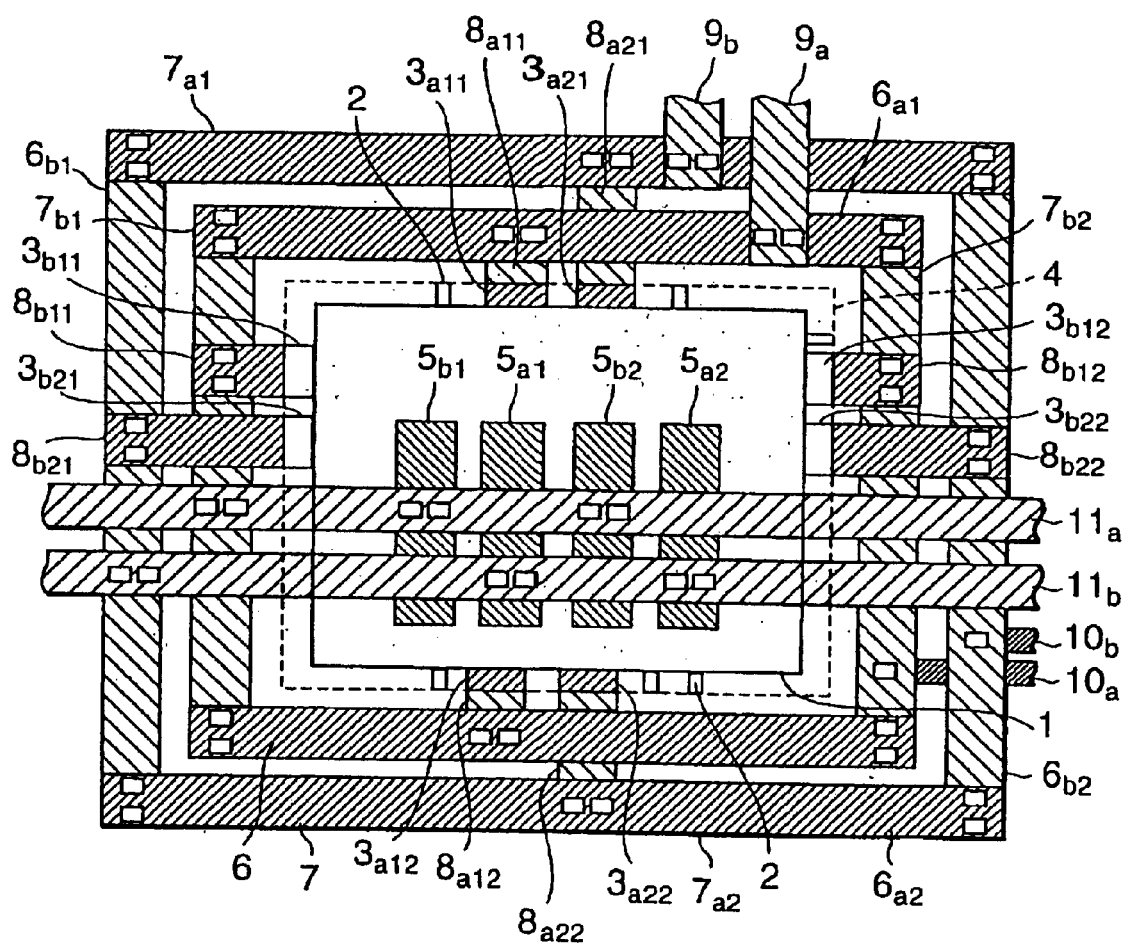
FIG. 17 is a top view showing a memory macro that forms a cell base IC designed by the design method of the conventional semiconductor integrated circuit and a peripheral portion thereof.
Figure 18:
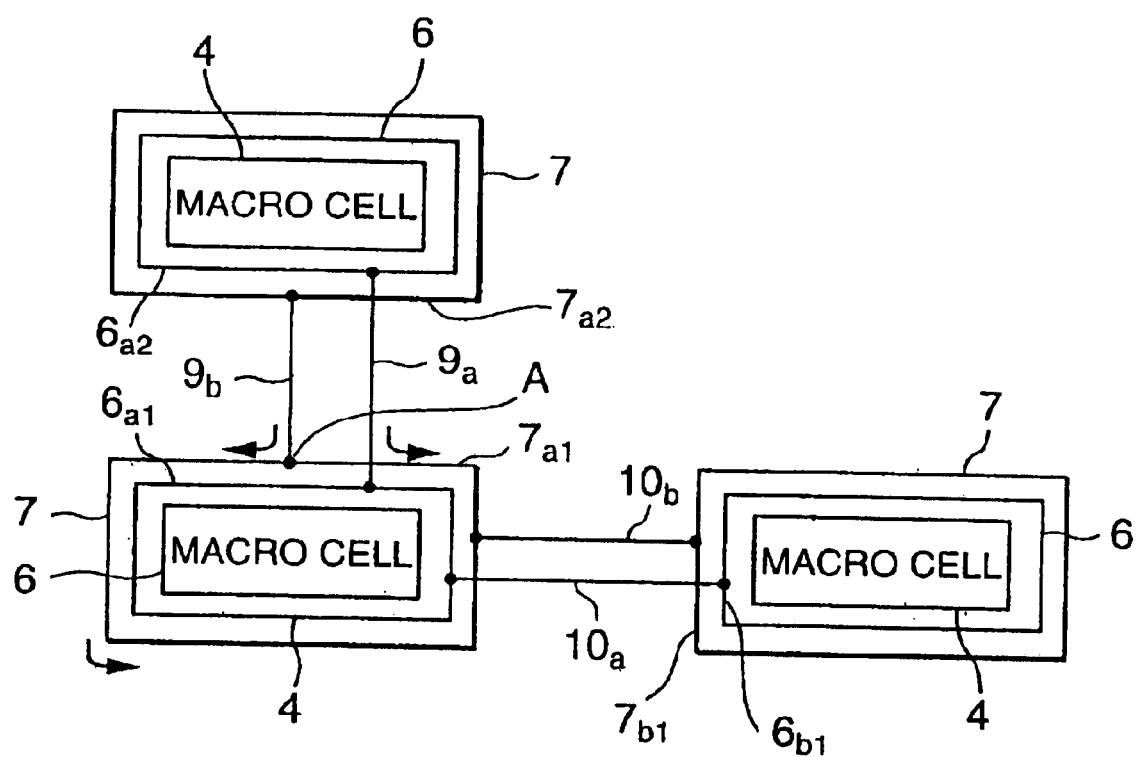
FIG. 18 is a view explaining disadvantages of the conventional semiconductor integrated circuit.

(5) It is assumed that the minimum distance Dmin (refer to FIG. 14) between terminals $28_1$ and $28_2$ of the same kind or different kind adjacent in the vertical direction or horizontal direction follows the spacing rule of the wiring of the third and fourth layers. Additionally, terminals $29_1$ and $29_2$ of the same kind or different kind adjacent in the vertical direction or horizontal direction may be arranged such that their short and long sides are opposite to each other as shown in FIG. 15.

(6) The lengths (refer to FIG. 16) of the long sides of a power terminal 30 and a ground terminal 31 arranged in the horizontal direction must be shorter than pitch $P_4$ (e.g., 6 μm) of the vertical power wiring and the vertical ground wiring formed in the vertical direction of the fourth layer. This is because there is a possible that the current will not be supplied from the artificial orbital power ring to the power terminal 30 and the ground terminal 31.

An explanation will be given of the design method of the power wring to the macro cell that satisfies the aforementioned conditions with reference to the flowchart of FIG. 5 and FIGS. 6 to 10.

Figure 5:
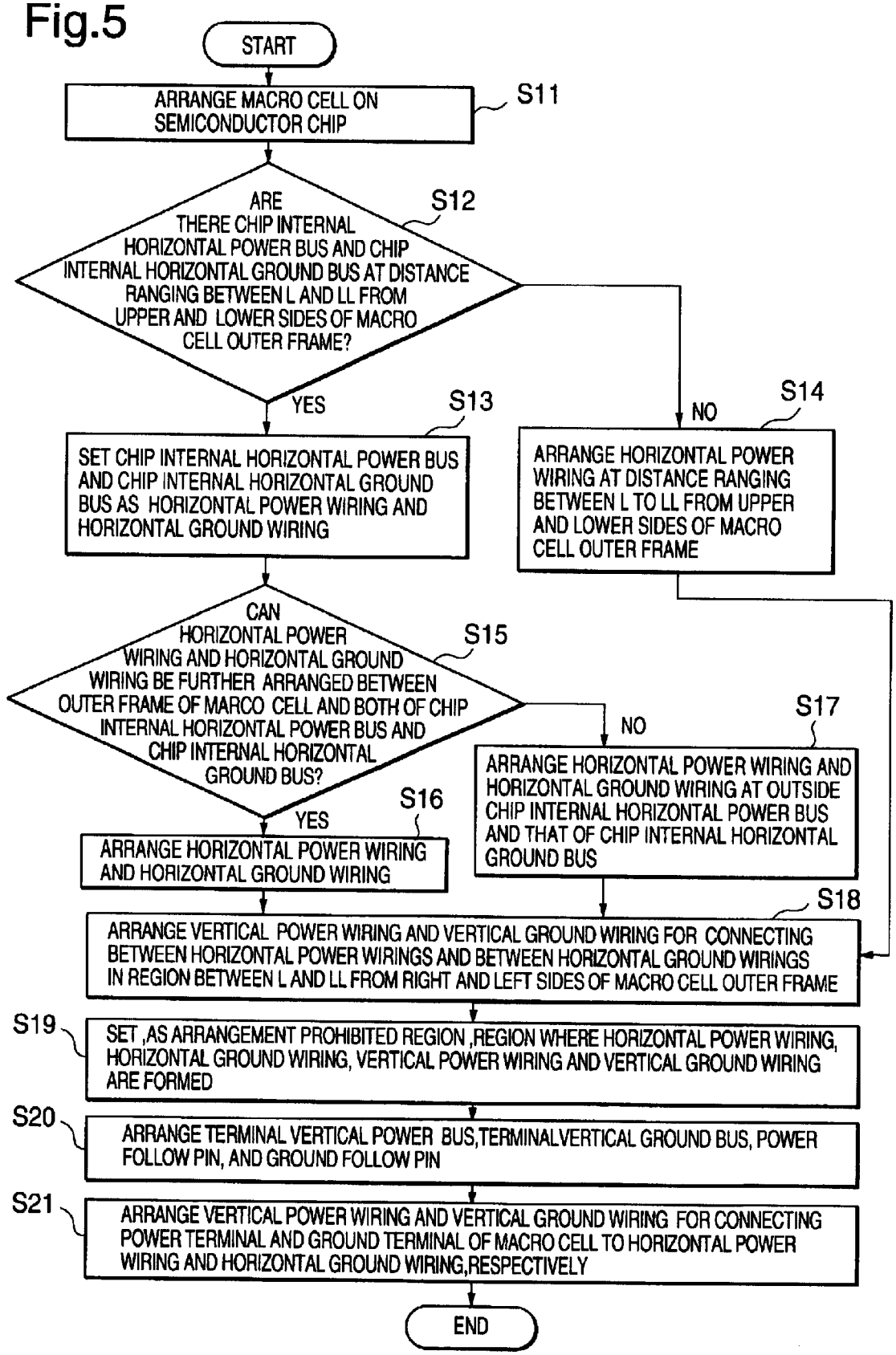
FIG. 5 is a flowchart showing a manufacturing method for the semiconductor integrated circuit of the embodiment of the present invention.

First, the CPU 2101 reads a design program from the memory 2102 and executes it so as to carry out processing of step S11 shown in FIG. 5. In the processing of step S11, the macro outer frame 21 including the macro core 22 and the signal terminals 23 is placed at a desired position on a chip 60 based on data of the chip and that of the macro cell, which are read from the memory, and processing goes to step S12.

In step S12, the CPU 2102 reads information stored in the memory 2102 that is relevant to the chip internal horizontal ground bus 63 and the chip internal horizontal power bus 64, which are wired in the fifth layer. Then, the CPU 2102 determines whether or not there is a chip internal horizontal ground bus 63 and a chip internal horizontal power bus 64 at a distance within a range of L to LL inclusive from the upper side and the lower side outside the macro outer frame 21. If there is a chip internal horizontal power bus 63 and a chip internal horizontal ground bus 64 at a distance within a range of L to LL inclusive, processing moves to step S13, and if there is not a chip internal horizontal power bus 63 and a chip internal horizontal ground bus 64 at a distance within a range of L to LL inclusive, processing moves to step S14.

Instep S13, the CPU 2101 sets the chip internal horizontal power bus 63 and the chip internal horizontal ground bus 64, which are present in a region defined by the lengths L to LL, as horizontal power wiring 41b and horizontal ground wiring 41a, respectively, as shown in FIG. 9, and processing goes to step S15. Additionally, FIG. 9 shows one in which the chip internal horizontal ground bus and the chip internal horizontal power bus are present with respect to the upper and lower sides of the macro outer frame.

Figure 6:
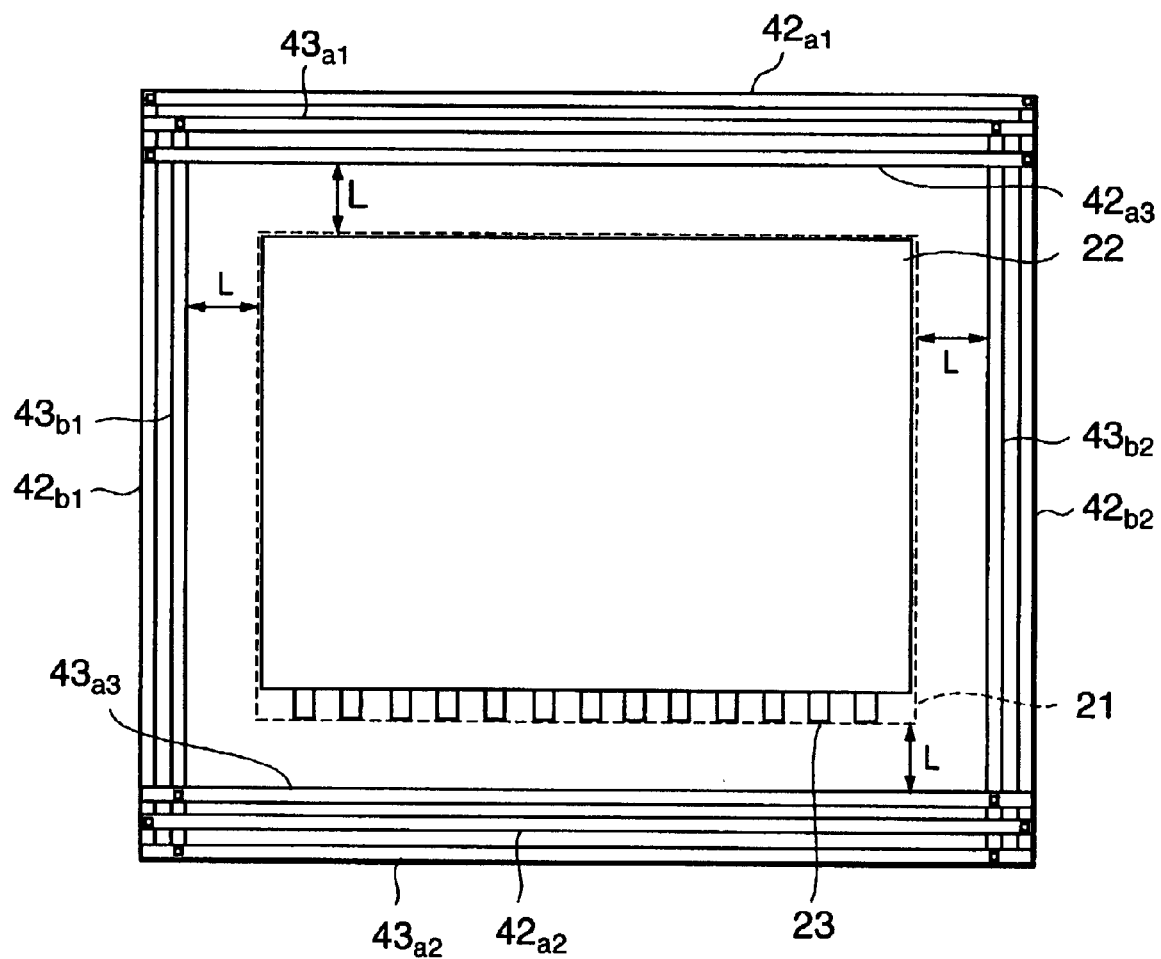
FIG. 6 is a process view of the manufacturing method for the semiconductor integrated circuit.

In step S14, the CPU 2101 arranges the horizontal power wiring $43_{a1}$ to $43_{a3}$ and horizontal ground wiring $42_{a1}$ to $42_{a3}$ in the region between lengths L to LL as shown in FIG. 6. Here, it is assumed that the horizontal power wiring and the horizontal ground wiring are alternately arranged and that the number of wiring is decided by the width of the region, that of the horizontal power wiring to be arranged, that of the horizontal ground wiring to be arranged, and the pitch therebetween. If the arrangement ends, processing goes to step S18.

In step S15, the CPU 2101 determines whether or not horizontal power wiring and horizontal ground wiring can be further arranged between the chip internal horizontal power wiring or the chip internal horizontal ground wiring and the outer frame of macro cell. If they can be arranged, processing goes to step S16, and if they cannot be arranged, processing moves to step S17. In other words, the CPU determines whether or not the horizontal power wiring with a predetermined width (for example, 0.6 μm) of the fifth layer and the horizontal ground wiring thereof can be arranged in a region interposed between the detected chip internal horizontal power bus 41b and chip internal horizontal ground bus 41a and the macro outer frame 21 with a preset pitch (for example, 0.6 μm).

In step S16, the CPU 2101 arranges the horizontal power wring and the horizontal ground wiring between the macro cell outer frame and both of the chip internal horizontal power bus and the chip internal horizontal ground bus, and processing moves to step S18. For example, if the distances between the macro cell outer frame and both of the chip internal horizontal power bus and chip internal horizontal ground bus are 2.4 μm, the width of the horizontal power wiring and that of the horizontal ground wiring are 0.6 μm, and the pitch width is 0.6 μm, the CPU 2101 arranges the horizontal ground wiring and horizontal power wiring one by one.

In step S17, the CPU 2101 arranges the horizontal power wiring and horizontal ground wiring in a region between the outside of the chip internal horizontal power bus and that of the chip internal horizontal ground bus and the length LL from the macro cell outer frame as shown in FIG. 9, and processing goes to step S18. For example, it is assumed that the width of the chip internal horizontal power bus and that of the chip internal horizontal ground bus are 1.2 μm, L is 0.6 μm, LL is 4.2 μm, the width of the horizontal power wiring and that of the horizontal ground wiring are 0.6 μm, the pitch width is 0.6 μm, and the chip internal horizontal power bus and the chip internal horizontal ground bus are placed at the position 0.6 μm away from the macro outer frame 21. The CPU 2101 arranges the horizontal power wiring and the horizontal ground wiring one by one as shown in FIG. 9.

Additionally, in steps S16 and S17, if the chip internal horizontal power wiring and the chip internal horizontal ground wiring are formed on only one of upper and lower sides, the same processing as that of step S14 is provided to the region between lengths L and LL from the other side, making it possible to form the horizontal power wiring and the horizontal ground wiring.

Figure 10:
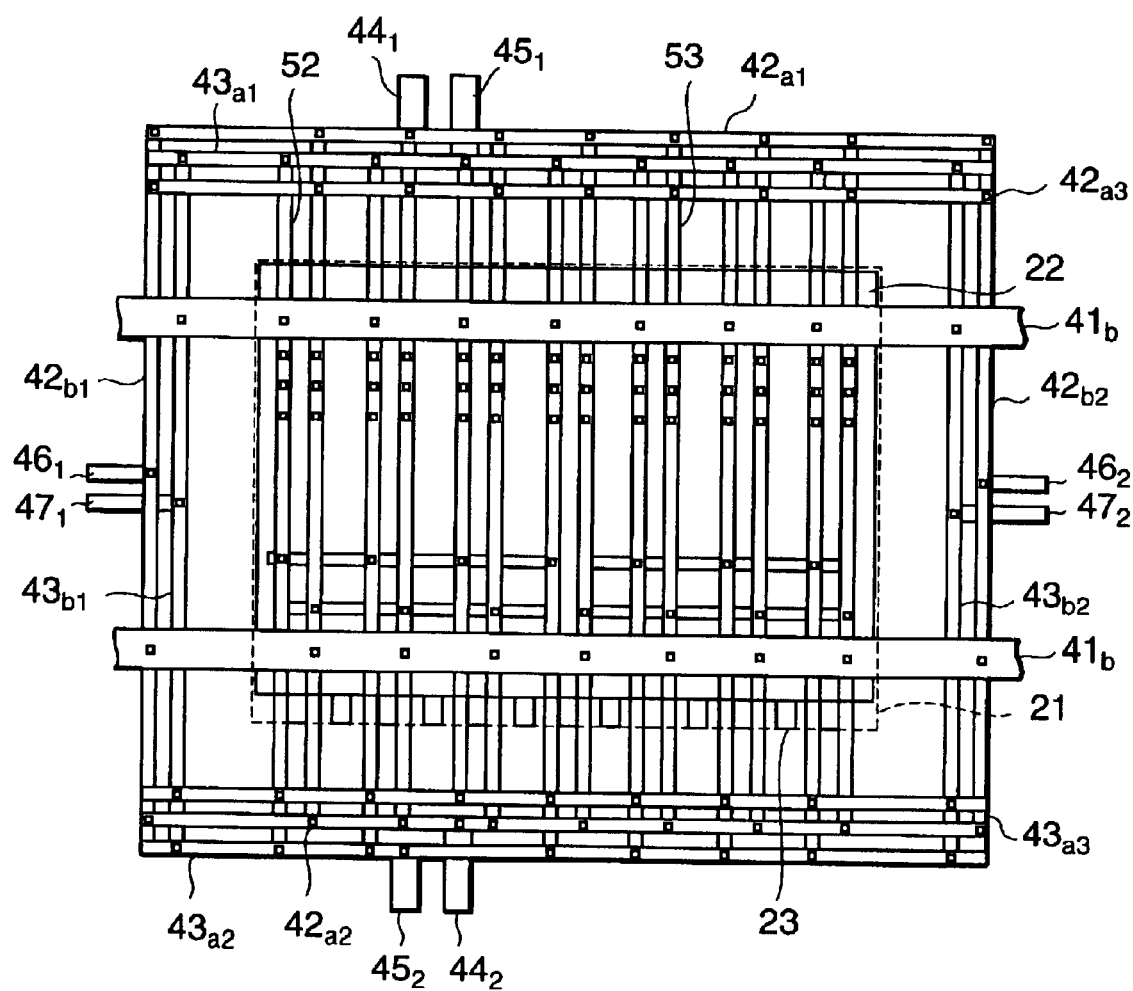
FIG. 10 is a view showing another application example of the semiconductor integrated circuit to which the present invention is applied.

In step S18, the CPU 2101 arranges the vertical terminal power wiring $43_{b1}$, $43_{b2}$ and the vertical ground wiring $42_{b1}$, $42_{b2}$ in the region between lengths L and LL from the left and right sides of the macro cell outer frame 21 as shown in FIGS. 6, 9 and 10. Then, contact holes for connecting the horizontal power wiring $43_{a1}$ to $43_{a3}$ and horizontal ground wiring $42_{a1}$ to $42_{a3}$ to the vertical power wiring $43_{b1}$, $43_{b2}$ and the vertical ground wiring $42_{b1}$, $42_{b2}$, and processing moves to step S19.

In step S19, a region where an artificial orbital ring, which includes the vertical power wiring $43_{b1}$, $43_{b2}$, vertical ground wiring $42_{b1}$, $43_{b2}$, horizontal power wiring $43_{a1}$ to $43_{a3}$, and horizontal ground wring $42_{a1}$ to $42_{a3}$, is formed is set as an arrangement prohibited region by the CPU 2101, and processing goes to step S20.

Figure 7:
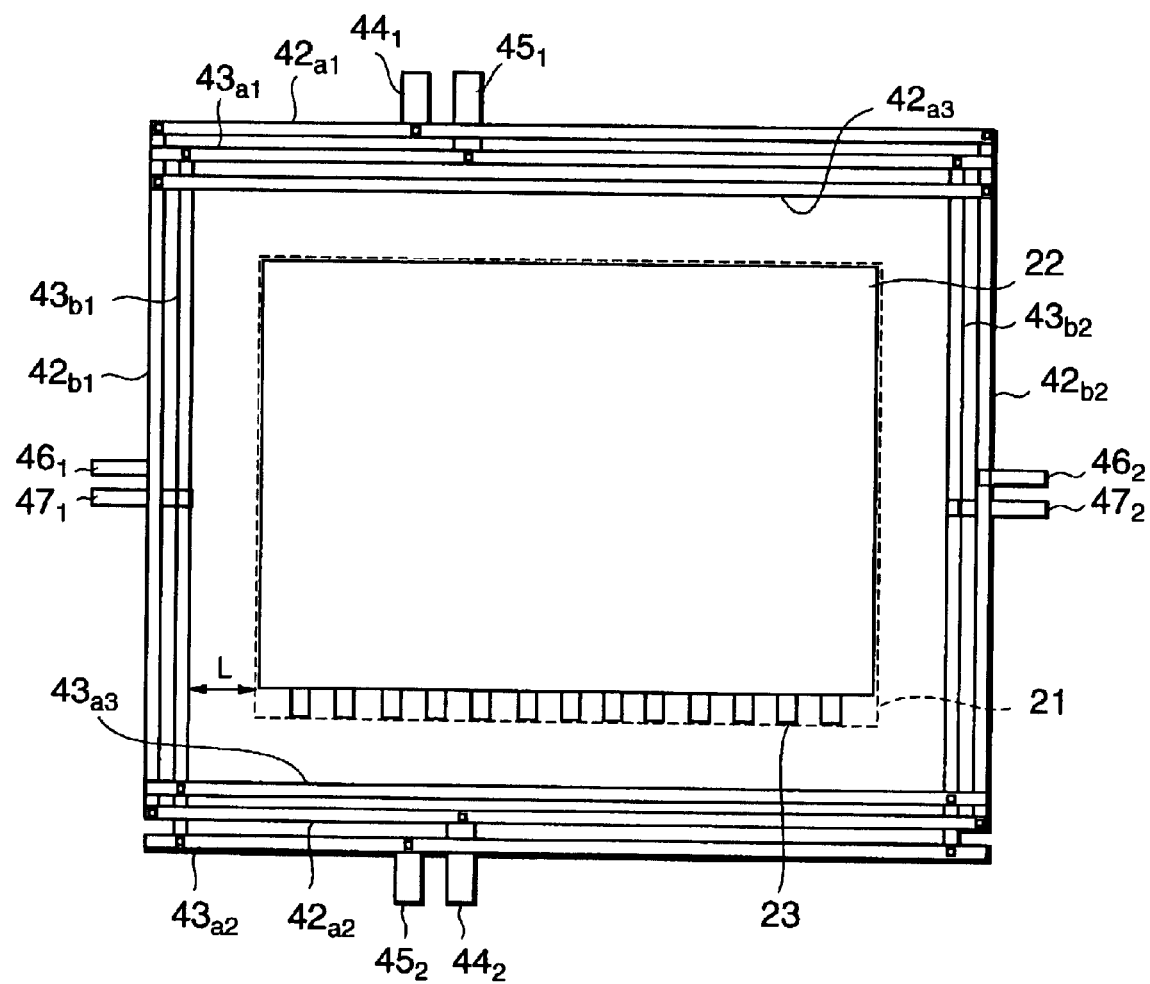
FIG. 7 is a process view of the manufacturing method for the semiconductor integrated circuit.

In step S20, the CPU 2101 arranges the terminal vertical power bus $45_1$ and terminal vertical ground bus $44_1$ to external two horizontal power wiring $43_{a1}$ and horizontal ground wiring $42_{a1}$ that constitute the artificial orbital ring. At this time, the terminal vertical power bus and the terminal vertical ground bus are connected to the horizontal power wiring and the horizontal ground wiring of the same potential, which they first meet, through the contact holes. It is assumed that the terminal vertical power bus $45_1$ and the terminal vertical ground bus $44_1$ are formed by the wiring layer of the fourth layer, and are connected to the chip internal power bus and the chip internal ground bus (not shown). Moreover, as shown in FIG. 7, the CPU 2101 arranges the power follow pins 471 and 472 and the ground follow pins $46_1$ and $46_2$ in accordance with the vertical power wiring $43_{b1}$, $43_{b2}$, vertical ground wiring $42_{b1}$, $42_{b2}$ and connects them through the contact holes.

In step S21, the CPU 2101 arranges the vertical power wiring 52 and the vertical ground wiring 53, which are formed by the wiring layer of the fourth layer, and connects the power terminal and ground terminal of the macro cell, which are formed by the wiring layer of the third layer, to the horizontal power wiring and the horizontal ground wring, which are formed by the wring layer of the fifth layer, through the contact holes. At this time, the power terminal $25_2$ and the ground terminal $26_2$, which intersect the vertical power wiring 52 and the vertical ground wiring 53, are also connected to the vertical power wiring 52 and the vertical ground wiring 53 through the contact holes, respectively.

At the time of arranging the vertical power wiring and the vertical ground wiring, the CPU detects the positions of the power terminal and ground terminal of the macro cell and specifies the arrangement positions of the vertical power wiring and the vertical ground wiring. Namely, the CPU arranges the vertical power wiring and the vertical ground wiring to pass on the power terminal $25_1$ and the ground terminal $26_1$ where the long sides are formed along the vertical direction (vertical direction is used as a detecting direction in this example), and forms contacts. In connection with the power terminal $25_2$ and the ground terminal $26_2$ where the long sides are formed along the horizontal direction, the CPU forms contacts at a location that intersects the vertical power wiring and the vertical ground wiring.

For example, as shown in FIG. 1, the CPU 2101 detects the power terminal $25_1$ and the ground terminal $26_1$ and arranges the vertical power wiring 52 and the vertical ground wiring 53 in accordance with the detected power terminal $25_1$ and ground terminal $26_1$. Then, the power terminal $25_1$ and the horizontal power wiring $43_{a1}$ to $43_{a3}$ are connected by the vertical power wiring 52 and the contact holes, and the ground terminal $26_1$ and the horizontal ground wiring $42_{a1}$ to $42_{a3}$ are connected by the vertical ground wiring 53 and the contact holes. At this time, the power terminal $25_2$ and the ground terminal $26_2$ are also connected to the vertical power wiring 52 and the vertical ground wiring 53, respectively, through the contact holes.

In FIG. 1, in the case where the chip internal horizontal power bus and the chip internal horizontal ground bus are placed in the vicinity of the macro outer frame, as shown in FIG. 9, the horizontal ground wiring 41a (chip internal horizontal ground bus) for the horizontal ground wiring $42_{a3}$ and the vertical ground wiring 53 are connected to each other through the contract hole, and the horizontal power wiring 41b (chip internal horizontal power bus) for the horizontal power wiring $43_{a3}$ and the vertical power wiring 52 are connected to each other through the contract hole.

Moreover, in FIG. 1, in the case where the chip internal horizontal power bus 41b and the chip internal horizontal ground bus 41a, which are formed by the wiring of the fifth layer, are arranged on the macro cell, the vertical power wiring 52 and the vertical ground wiring 53, which are formed of the fourth layer, are connected to the chip internal horizontal power bus 41b and the chip internal horizontal ground bus 41a, which intersect with the vertical power wiring 52 and the vertical ground wiring 53, through the contact holes, respectively, as shown in FIG. 10.

Moreover, as shown in FIG. 1, the three-wiring structure of horizontal ground wiring $42_{a1}$-horizontal power wiring $43_{a1}$-horizontal ground wiring $42_{a3}$ makes it possible to arrange the vertical power wiring 52 and the vertical ground wiring 53 in spite of the connecting position of the terminal vertical ground bus and the terminal vertical power bus. Namely, in the case where the terminal vertical power/ground buses are placed at the positions of the terminal vertical ground bus $44_1$ and the terminal vertical power bus $45_1$, the horizontal ground wiring $42_{a3}$ and the horizontal power wiring $43_{a1}$ can be connected to the terminal vertical ground bus $44_1$ and the terminal vertical power bus $45_1$, respectively, even if there is no external horizontal ground wiring $42_{a1}$. However, in the case where the terminal vertical power/ground buses are placed at the positions of the terminal vertical ground bus $44_2$ and the terminal vertical power bus $45_2$, the terminal vertical power bus $45_2$ is connected to the horizontal power wiring $43_{a3}$ if there is no external horizontal power wiring $43_{a2}$. As a result, the vertical ground wiring 53 passes under the horizontal power wiring $43_{a3}$, so that the vertical ground wring 53 cannot be connected to the horizontal power wiring $43_{a2}$. Accordingly, the three-wiring structure of horizontal ground wiring $42_{a1}$-horizontal power wiring $43_{a1}$-horizontal ground wiring $42_{a3}$ and that of horizontal power wiring $43_{a2}$-horizontal ground wiring $42_{a2}$-horizontal power wiring $43_{a3}$ make it possible to connect both ends of the vertical power wiring and the vertical ground wiring to the corresponding horizontal power wiring and horizontal ground wiring, respectively, even if the terminal vertical ground bus and the terminal vertical power bus are connected to anywhere.

In this way, the horizontal power wiring and the horizontal ground wiring formed at the upper portion of the macro outer frame can be respectively connected to the horizontal power wiring and the horizontal ground wiring formed at the lower portion thereof by use of numerous vertical power wiring 52 and vertical ground wiring 53, whereby making it possible to reduce the voltage drop at the position away from the terminal vertical power bus $45_1$ and the terminal vertical ground bus $44_1$.

Figure 8:
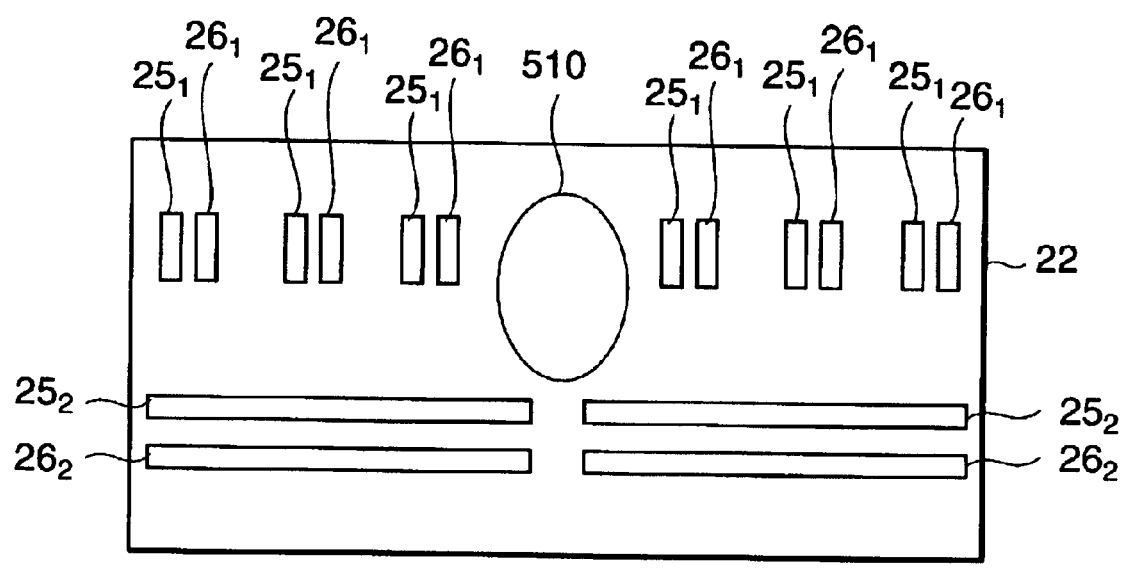
FIG. 8 is a view showing the arrangement of power/ground terminals of the macro cell.

Additionally, as shown in FIG. 8, when the CPU searches the position where the power terminal $25_1$ and the ground terminal $26_1$ of which long sides are arranged in the vertical direction are defined and the length of the short side thereof, a plurality of reinforcing wiring, which is composed of reinforcing vertical power wiring and reinforcing vertical ground wiring formed by the wiring layer of the fourth layer, is provided to make up for a current supply capability if there is a region 510 where the position at which the power terminal $25_1$ and the ground terminal $26_1$ are defined is loose. The reinforcing wiring is connected to the horizontal power wiring and the horizontal ground wiring, similar to the vertical power wiring and the vertical ground wiring.

Moreover, the formation of this reinforcing wiring can obtain the secondary effect shown below. Namely, in the semiconductor integrated circuit, when the wiring is not uniformly formed on the chip, light comes into the loose region and a desired pattern shape cannot be obtained at a patterning exposure time, and this cause a danger that exerts an adverse effect on yield of the semiconductor integrated circuit. Accordingly, if the reinforcing wiring is uniformly formed on the wiring region 510 of the fourth layer as mentioned above, yield of the semiconductor integrated circuit is improved. If the lower limit of wiring density is, for example, 20% as a standard for forming the reinforcing wiring and the region, which is loose more than five times, is present, it is desirable to form the wiring on the region. Therefore, in this example, since the reinforcing wring, which is composed of a pair of reinforcing power wiring and reinforcing ground wiring, is formed, it is necessary to form the aforementioned reinforcing wiring if there is the loose region 510, which is loose more than 10 times with respect to the pitch of the power terminal $25_1$ and that of the ground terminal $26_1$. Here, it is assumed that the width of the reinforcing power wiring and that of the reinforcing ground wiring are set to, for example, 0.6 μm, and that the pitch of the power terminal $25_1$ and that of the ground terminal $26_1$ are set to, for example, 0.6 μm. Accordingly, the chip area can be reduced correspondingly, and it is possible to decide the structure of the memory macro and the connecting method of the power wiring without depending on the fundamental information, which the semiconductor integrated circuit possesses, particularly information of the power wiring. This makes it possible to shorten the development of the memory macro and the developing time of the semiconductor integrated circuit. Moreover, it is possible to improve yield of the manufacturing of the semiconductor integrated circuit of this example and to suppress the cost. Still moreover, since the chip internal horizontal ground bus and the chip internal horizontal power bus with a relatively large width or the vertical ground bus and vertical power bus are used to form the artificial orbital power ring, the current supply capability is high as compared with the conventional case.

Thus, according to the present invention, since it is possible to connect the artificial orbital ring, which is formed by the power wiring and ground wiring, by use of numerous vertical power wiring and vertical ground wiring, the voltage drop can be reduced and the current can be supplied to the power terminal and the ground terminal of the third layer of the macro cell from the vertical power wiring and vertical ground wiring of the fourth layer. This eliminates the need for providing the power and ground lead-in terminals formed in the second and third layers of the conventional macro cell. Accordingly, the power lead-in power lines $8_{b21}$, $8_{b22}$, and power lead-in ground lines $8_{b11}$, $8_{b12}$ formed on the orbital ring, which were conventionally needed, becomes unnecessary. The design of the macro cell, which was designed after deciding position data of these lead-in lines, can be carried out concurrently with the design of the semiconductor chip to make it possible to shorten the design time of system LSI.

Though the embodiment of this invention has been explained with reference to the drawings, the specific structure is not limited to the above embodiment. A change in design may be included in this invention within the range that does not depart from the sprit and scope of this invention.

For example, in step S12, in the chip internal power wiring, which is composed of a pair of the horizontal ground bus 41a and horizontal power bus 41b to be wired in the fifth layer, one, which is the outside of the macro outer frame 21 and which is nearest to the macro outer frame 21, is detected as a candidate of the horizontal power wiring or horizontal ground wiring that constitutes the artificial orbital ring. However, for instance, in the chip internal power wiring, which is composed of a pair of the vertical ground bus 41a and vertical power bus to be wired in the fourth layer, one, which is the outside of the macro outer frame 21 and which is nearest to the macro outer frame 21, may be detected as a candidate of the vertical power wiring or vertical ground wiring that constitutes the artificial orbital ring. The chip internal vertical ground bus 61 and chip internal vertical power bus 62 are made of a metallic film such as aluminum as shown in FIG. 3, and have a predetermined width (for example, 1.2 μm), and are formed in a vertical direction with a predetermined distance. In this case, for example, in processing in step S20, the power terminal and ground terminal to be recognized are changed from the power terminal $25_1$ and ground terminal $26_1$ to the power terminal $25_2$ and ground terminal $26_2$. Moreover, in processing in step S18, the power line and ground line to be formed in the memory macro are changed from the vertical power line 52 and vertical ground line 53 to the horizontal power wiring and horizontal ground wiring. It is required that the directions of terminals and wiring to be recognized and wired should be changed from the vertical direction to the horizontal direction.

As explained above, according to the semiconductor integrated circuit of the present invention, by providing the plurality of vertical power wiring for connecting the plurality of horizontal power wiring formed on two opposite sides of the macro cell and the vertical power wiring for connecting the horizontal ground wiring formed on two opposite sides of the macro cell, it is possible to reduce the voltage drop. Also, by connecting these vertical power wiring and the vertical ground wiring to the power terminal of the macro cell and the ground terminal thereof, it is possible to supply the stable current to the macro cell.

Further, according to the design method of the semiconductor integrated circuit of the present invention, the design of a macro cell and the design of an artificial orbital ring for supplying the current to the macro cell can be separately carried out so as to make it possible to design the system LSI on which the macro cells are mounted for a short time.

What is claimed is:

1. A semiconductor integrated circuit comprising:
    a macro cell arranged on a chip;
    a plurality of power terminals formed on an upper portion of said macro cell, and a plurality of ground terminals formed thereon;
    a first wiring group including at least one power wiring and one ground wiring extended in a first direction along a first side of said macro cell;
    a second wiring group including at least one power wiring and one ground wiring extended in said first direction along a second side of said macro cell opposite to said first side; and
    a third wiring group, which is arranged in a second direction on said macro cell, and which include at least one power wiring and one ground wiring for establishing connection between said first wiring group and said second wiring group,
    wherein the power wiring and the ground wiring which form said third wiring group are respectively connected to the corresponding power terminal and the corresponding ground terminal on said macro cell and said first wiring group includes one ground wiring and two power wirings arranged on both sides of said wiring, and said second wiring group includes one power wiring and two ground wirings arranged on both sides of said power wiring.

2. The semiconductor integrated circuit according to claim 1, further comprising:
    a fourth wiring group, which is extended in said second direction along a third side of said macro cell, and which includes at least one power wiring and one ground wiring for establishing connection between said first wiring group and said second wiring group; and
    a fifth wiring group, which is extended in said second direction along a fourth side opposite to said third side, and which includes at lease one power wiring and one ground wiring for establishing connection between said first wiring group and said second wiring group,
    wherein said first wiring group, second wiring group, fourth wiring group and fifth wiring group form an artificial orbital ring which encloses an outer frame of said macro cell.

3. The semiconductor integrated circuit according to claim 1, wherein said power wirings and said ground wirings which form said first wiring group and said second wiring group are alternatively arranged in each wiring group.

4. The semiconductor integrated circuit according to claim 1, wherein any one of said first wiring group and said second wiring group includes a chip internal power wiring formed on the chip.

5. The semiconductor integrated circuit according to claim 4, wherein the chip internal power wiring on said macro cell is connected to one power wiring which form said third wiring group perpendicular to the chip internal power wiring.

6. The semiconductor integrated circuit according to claim 1, wherein any one of said first wiring group and said second wiring group includes a chip internal ground wiring formed on the chip.

7. The semiconductor integrated circuit according to claim 1, wherein power wirings and ground wirings which form said first wiring group and said second wiring group are formed by the same wiring layer, and are formed by a wiring layer different from said power terminals, said ground terminals, and said at least one power wiring and said at least one ground wiring which form said third wiring group.

8. A semiconductor integrated circuit comprising:
    a macro cell arranged on a chip;
    a plurality of power terminals formed on an upper portion of said macro cell, and a plurality of ground terminals formed thereon;
    a first wiring group including at least one power wiring and one ground wiring extended in a first direction along a first side of said macro cell;
    a second wiring group including at least one power wiring and one ground wiring extended in said first direction along a second side of said macro cell opposite to said first side; and a third wiring group, which is arranged in a second direction on said macro cell, and which include at least one power wiring and one ground wiring for establishing connection between said first wiring group and said second wiring group,
    a third wiring group, which is arranged in a second direction on said macro cell, and which include at least one power wiring and one ground wiring for establishing connection between said first wiring group and said second wiring group,
    wherein the power wiring and the ground wiring which form said third wiring group are respectively connected to the corresponding power terminal and the corresponding ground terminal on said macro cell and, any one of said first wiring group and said second wiring group includes a chip internal ground wiring formed on the chip and, wherein the chip internal ground wiring on said macro cell is connected to one ground wiring which form said third wiring group perpendicular to the chip internal ground wiring.

9. A semiconductor integrated circuit manufacturing method comprising the steps of:
    arranging a macro cell having a first side, a second side opposite to said first side, a third side, and a fourth side opposite to said third side on a semiconductor chip, and having at least one power terminal and one ground terminal on its top surface;
    arranging a first wiring group including at least one power wiring and one ground wiring in a predetermined range from said first side and extended in a first direction;
    arranging a second wiring group including at least one power wiring and one ground wiring in said predetermined range from said second side and extended in a first direction;
    arranging a third wiring group including at least one power wiring and one ground wiring in said predetermined range form said third side and extended in a second direction so as to connect said first wiring group to said second wiring group;
    arranging a fourth wiring group including at least one power wiring and one ground wiring in said predetermined range from said fourth side and extended in said second direction so as to connect said first wiring group to said second wiring group; and
    arranging a fifth wiring group including at least one power wiring and one ground wiring between said first wiring group and said second wiring group in accordance with said power terminal and said ground terminal, wherein in said step of arranging said first wiring group and said step of arranging said second wiring group, when any one of a chip internal power bus and a chip internal ground bus is present in said predetermined range, a step of setting these buses as a part of any one said first wiring group and said second wiring group is included.

10. The semiconductor integrated circuit manufacturing method according to claim 9, wherein in said step of arranging said first wiring group and said step of arranging said second wiring group, a step of arranging the power wiring and the ground wiring alternatively is included.

11. A design program of a semiconductor integrated circuit for causing a computer to implement the functions described in claim 10.

12. The semiconductor integrated circuit manufacturing method according to claim 9, further comprising the step of connecting the power wiring of said first wiring group and the ground wiring thereof to a terminal power bus and a terminal ground bus to be connected to power and ground, respectively, before said step of arranging said fifth wiring group.

13. A design program of a semiconductor integrated circuit for causing a computer to implement the functions described in claim 12.

14. The semiconductor integrated circuit manufacturing method according to claim 9, further comprising the step of forming the power wirings of said first wiring group and said second wiring group and the ground wirings thereof by a wiring layer different from said power terminal and said ground terminal.

15. A design program of a semiconductor integrated circuit for causing a computer to implement the functions described in claim 14.

16. The semiconductor integrated circuit manufacturing method according to claim 9, wherein in said step of arranging said fifth wiring group, when thee is a region where a distance between the power wiring and the ground wiring which form said fifth wiring group is formed more than a predetermined distance, a step of arranging an auxiliary power wiring and an auxiliary ground wiring between said first wiring group and said second wiring group with respect to the region.

17. A design program of a semiconductor integrated circuit for causing a computer to implement the functions described in claim 16.

18. A design program of a semiconductor integrated circuit for causing a computer to implement the functions described in claim 9.

* * * * *